(12) United States Patent
Ito et al.

(10) Patent No.: US 11,362,639 B2
(45) Date of Patent: Jun. 14, 2022

(54) ACOUSTIC WAVE DEVICE, MULTIPLEXER, AND COMMUNICATION APPARATUS

(71) Applicant: KYOCERA Corporation, Kyoto (JP)

(72) Inventors: Motoki Ito, Ikoma (JP); Tetsuya Kishino, Nara (JP)

(73) Assignee: KYOCERA Corporation, Kyoto (JP)

( * ) Notice: Subject to any disclaimer, the term of this patent is extended or adjusted under 35 U.S.C. 154(b) by 252 days.

(21) Appl. No.: 16/629,900

(22) PCT Filed: Jul. 27, 2018

(86) PCT No.: PCT/JP2018/028281
§ 371 (c)(1),
(2) Date: Jan. 9, 2020

(87) PCT Pub. No.: WO2019/022236
PCT Pub. Date: Jan. 31, 2019

(65) Prior Publication Data
US 2021/0083644 A1 Mar. 18, 2021

(30) Foreign Application Priority Data
Jul. 27, 2017 (JP) .............................. JP2017-145729

(51) Int. Cl.
*H03H 9/02* (2006.01)
*H04B 1/00* (2006.01)

(52) U.S. Cl.
CPC .... *H03H 9/02228* (2013.01); *H03H 9/02157* (2013.01); *H04B 1/0057* (2013.01)

(58) Field of Classification Search
CPC ........... H03H 9/02228; H03H 9/02157; H04B 1/0057
See application file for complete search history.

(56) References Cited

U.S. PATENT DOCUMENTS

| | | | |
|---|---|---|---|
| 2013/0285768 A1 | 10/2013 | Watanabe et al. | |
| 2015/0102705 A1* | 4/2015 | Iwamoto | H01L 41/0805 310/313 B |
| 2019/0393856 A1* | 12/2019 | Iwamoto | H03H 9/02834 |

FOREIGN PATENT DOCUMENTS

WO  2012/086639 A1  6/2012

* cited by examiner

*Primary Examiner* — Samuel S Outten
(74) *Attorney, Agent, or Firm* — Procopio Cory Hargreaves and Savitch LLP

(57) ABSTRACT

An acoustic wave device includes a substrate 3, a multilayer film 5 on the substrate 3, an LT layer 7 which is located on the multilayer film and is configured by a single crystal of LiTaO₃, and an IDT electrode 19 on the LT layer 7. In the multilayer film 7, a differential value D obtained by subtracting a total value of values each obtained by multiplying a density and thickness of a film having a slower acoustic velocity than a transverse wave acoustic velocity of the LT layer 7 from a total value of values each obtained by multiplying a density and thickness of a film having a faster acoustic velocity than the transverse wave acoustic velocity of the LT layer 7 is negative, and a thickness of the LT layer 7 is less than 2p where a pitch of electrode fingers in the IDT electrode 19 is "p".

17 Claims, 15 Drawing Sheets

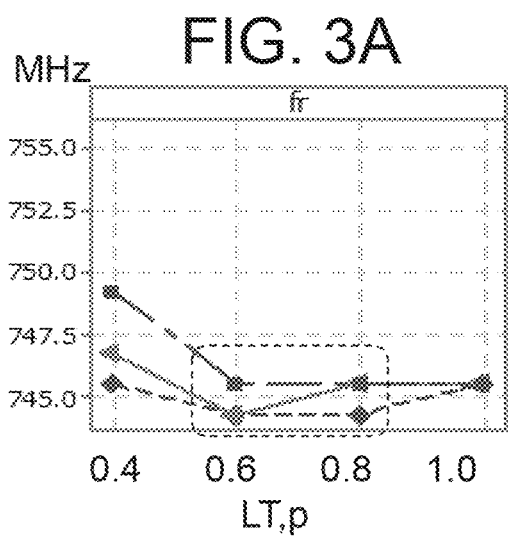
FIG. 3A
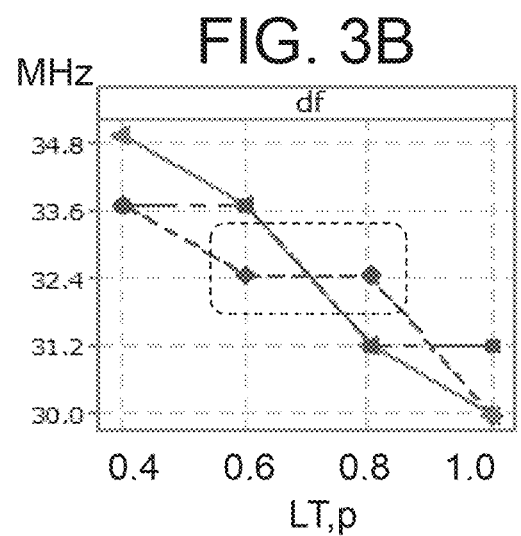
FIG. 3B
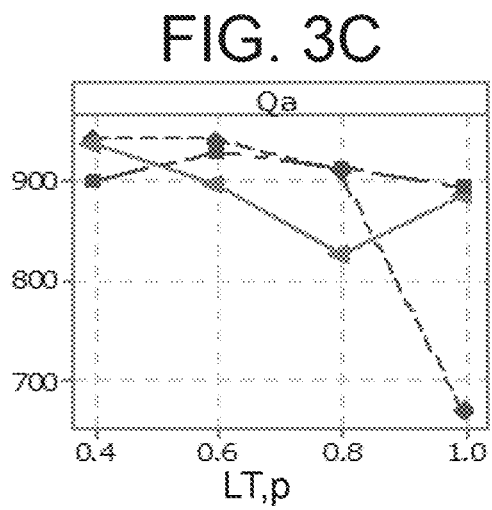
FIG. 3C
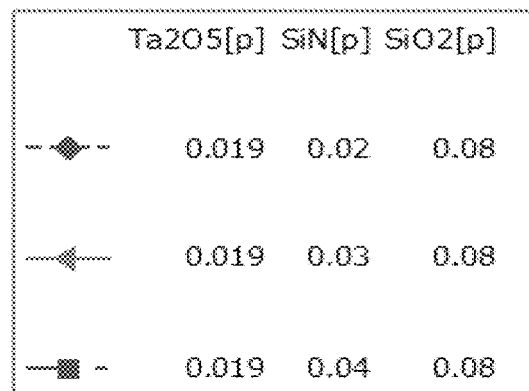

FIG. 12

| | | THICKNESS [p] | Δf[MHz] | Q | TOLERANCE [p] fr<±1.0 | Δf<±0.5 |
|---|---|---|---|---|---|---|
| MODEL 1 | LT | 0.74 | 31.5 | 3400 | ±0.09 | ±12% |
| | Ta2O5 | 0.029 | | | ±0.008 | ±28% |
| | SiO2 | 0.028 | | | ±0.012 | ±43% |
| | Si | | | | | |
| MODEL 2 | LT | 0.67 | 32.8 | 3000 | ±0.06 | ±9% |
| | SiO2 | 0.068 | | | ±0.014 | ±21% |
| | Ta2O5 | 0.039 | | | ±0.009 | ±23% |
| | Si | | | | | |
| MODEL 3 | LT | 0.65 | 29 | 3000 | ±0.15 | ±23% |
| | Si3N4 | 0.052 | | | ±0.013 | ±24% |
| | Ta2O5 | 0.1 | | | ±0.011 | ±11% |
| | Si | | | | | |
| BASIC CONFIGURATION | LT | 0.65 | 33 | 3400 | ±0.05 | ±8% |
| | Ta2O5 | 0.023 | | | ±0.004 | ±15% |
| | Si3N4 | 0.02 | | | ±0.010 | ±50% |
| | SiO2 | 0.084 | | | ±0.010 | ±12% |
| | Si | | | | | |
| REFERENCE EXAMPLE | LT | 0.7 | 34 | 2700 | ±0.03 | ±4% |
| | SiO2 | 0.175 | | | ±0.015 | ±9% |
| | AlN | 0.5 | | | ±0.200 | ±40% |
| | Si | | | | | |

FIG. 15

|  |  | THICKNESS [p] | Δf[MHz] | Q | TOLERANCE [p] fr<±1.0 Δf<±0.5 | |
|---|---|---|---|---|---|---|
| MODEL 4 | LT | 0.683 |  |  | ±0.118 | ±17% |
|  | AlN | 0.2 | 27 | 2500 | ±0.013 | ±7% |
|  | Ta2O5 | 0.297 |  |  | ±0.016 | ±5% |
|  | Si |  |  |  |  |  |
| MODEL 5 | LT | 0.706 |  |  | ±0.03 | ±4% |
|  | SiO2 | 0.366 | 32 | 2800 | ±0.054 | ±15% |
|  | Ta2O5 | 0.040 |  |  | ±0.020 | ±50% |
|  | Si |  |  |  |  |  |
| MODEL 6 | LT | 0.650 |  |  | ±0.15 | ±23% |
|  | Ta2O5 | 0.101 | 30 | 3300 | ±0.009 | ±9% |
|  | Si3N4 | 0.316 |  |  | ±0.047 | ±15% |
|  | SiO2 | 0.234 |  |  | ±0.134 | ±57% |
|  | Si |  |  |  |  |  |
| MODEL 7 | LT | 0.650 |  |  | ±0.15 | ±23% |
|  | Ta2O5 | 0.099 | 30 | 3000 | ±0.015 | ±15% |
|  | Si3N4 | 0.6 |  |  | ±0.100 | ±17% |
|  | AlN | 0.775 |  |  | ±0.125 | ±16% |
|  | Si |  |  |  |  |  | ns
ACOUSTIC WAVE DEVICE, MULTIPLEXER, AND COMMUNICATION APPARATUS

TECHNICAL FIELD

The present disclosure relates to an electronic part utilizing an acoustic wave, that is, an acoustic wave device, and to a multiplexer and a communication apparatus including the acoustic wave device.

BACKGROUND ART

Known in the art is an acoustic wave device which applies a voltage to an IDT (interdigital transducer) electrode on a piezoelectric body to cause the generation of an acoustic wave propagating through the piezoelectric body. The IDT electrode has a pair of comb-shaped electrodes. The pair of comb-shaped electrodes individually have pluralities of electrode fingers (corresponding to teeth of combs) and are arranged so as to intermesh with each other. In the acoustic wave device, a standing wave of the acoustic wave having a wavelength two times the pitch of the electrode fingers is formed. The frequency of this standing wave becomes a resonance frequency. Accordingly, the resonance point of the acoustic wave device is defined by the pitch of the electrode fingers.

International Patent Publication No. 2012/086639 proposes an acoustic wave device having a substrate, a high acoustic velocity film which is positioned on the substrate, a low acoustic velocity film which is positioned on the high acoustic velocity film, a piezoelectric body layer which is positioned on the low acoustic velocity film, and an IDT electrode which is positioned on the piezoelectric body layer. According to this acoustic wave device, an acoustic wave can be trapped in the piezoelectric body film by arranging the multilayer film, therefore a high Q-value can be realized.

SUMMARY OF INVENTION

It is desired to provide an acoustic wave device, a multiplexer and a communication apparatus each having a high Q-value.

An acoustic wave device according to one aspect of the present disclosure includes a substrate, a multilayer film on the substrate, an LT layer which is located on the multilayer film and is configured by a single crystal of LiTaO$_3$, and an IDT electrode on the LT layer. Further, in the multilayer film, a differential value obtained by subtracting a total value of values obtained by multiplying densities and thicknesses of films having slower acoustic velocities than a transverse wave acoustic velocity of the LT layer from a total value of values obtained by multiplying densities and thicknesses of films having faster acoustic velocities than the transverse wave acoustic velocity of the LT layer is negative. Further, a thickness of the LT layer is less than 2p when a pitch of electrode fingers in the IDT electrode is "p".

A multiplexer according to an aspect of the present disclosure includes an antenna terminal, a transmission filter which filters a signal output to the antenna terminal, and a reception filter which filters a signal input from the antenna terminal, at least one of the transmission filter and the reception filter including the acoustic wave device described above.

A communication apparatus according to an aspect of the present disclosure includes an antenna, the multiplexer described above with the antenna terminal connected to the antenna, and an IC which is connected with respect to the transmission filter and the reception filter on a side opposite to the antenna terminal about a signal route.

According to the above configuration, an acoustic wave element having a high Q-value can be provided.

BRIEF DESCRIPTION OF DRAWINGS

FIG. 3A, FIG. 3B, and FIG. 3C are graphs which respectively show results of simulation in the basic configuration.

FIG. 12 is a table of verification of robustnesses of the basic configuration, Model 1 to Model 3, and a reference example.

FIG. 15 is a table of verification of the robustness of a model according to a modification.

DESCRIPTION OF EMBODIMENTS

Figure 1:
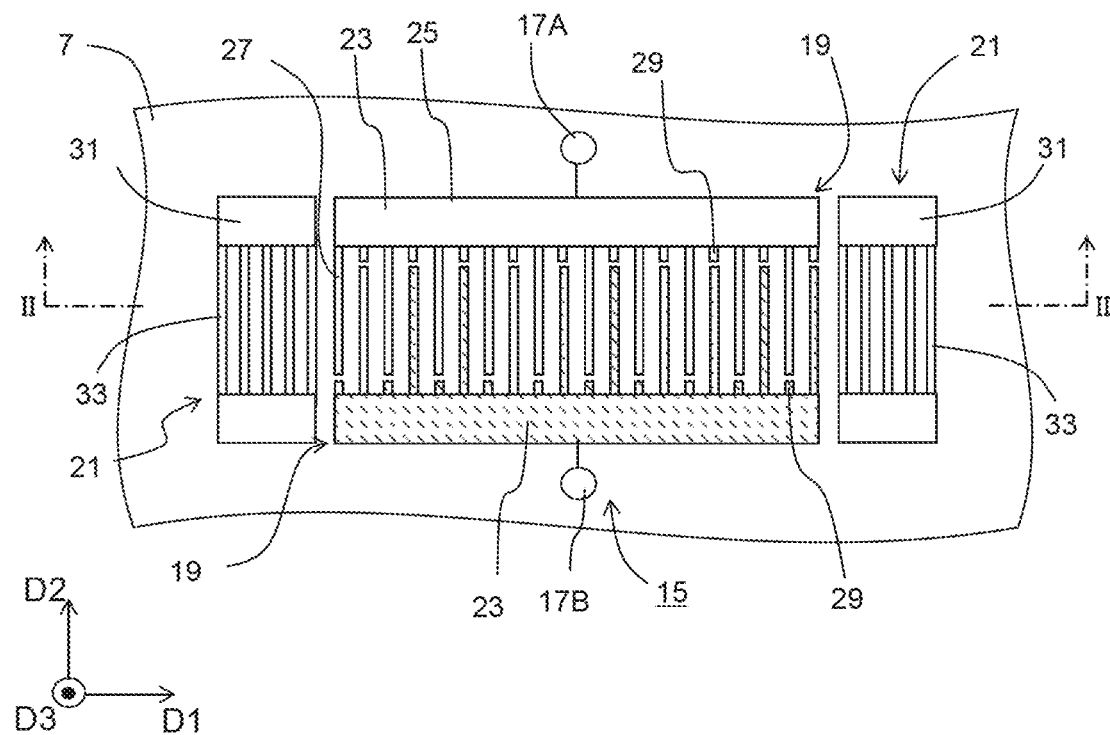
FIG. 1 is a plan view showing an acoustic wave device according to an embodiment.

Below, embodiments according to the present disclosure will be explained with reference to the drawings. Note that, the drawings used in the following explanation are schematic ones. Size ratios etc. in the drawings do not always coincide with the actual ones.

In the acoustic wave device according to the present disclosure, any direction may be defined as the "above" or "below". In the following explanation, however, for convenience, an orthogonal coordinate system comprised of a D1 axis, D2 axis, and D3 axis will be defined, and sometimes the "upper surface" or "lower surface", and other terms will be used where the positive side of the D3 axis is the upper part. Further, when referring to "viewed on a plane" or "plane perspective", unless particularly explained, this means "viewed in the D3 axis direction". Note that, the D1 axis is defined as parallel to the direction of propagation of the acoustic wave propagating along the upper surface of the LT layer which will be explained later, the D2 axis is defined as parallel to the upper surface of the LT layer and perpendicular to the D1 axis, and the D3 axis is defined as perpendicular to the upper surface of the LT layer.

(Overall Configuration of Acoustic Wave Device)

Figure 2:
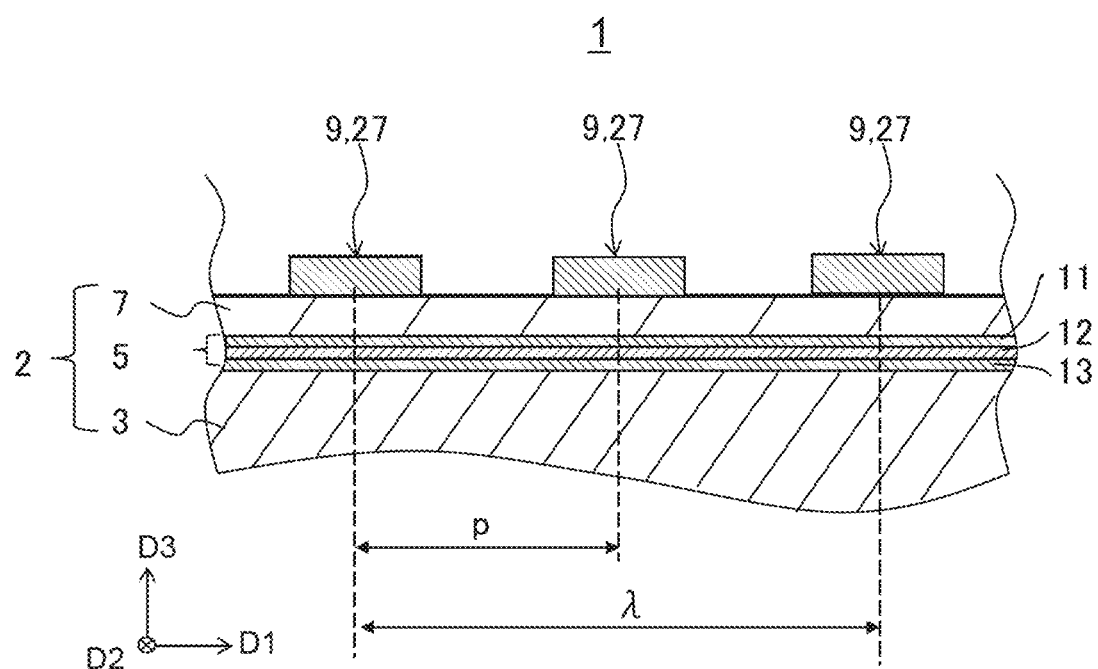
FIG. 2 is a cross-sectional view taken along the II-II line in the acoustic wave device in FIG. 1.

FIG. 1 is a plan view showing the configuration of a principal part of an acoustic wave device 1. FIG. 2 is a cross-sectional view of the principal part taken along the II-II line in FIG. 1.

The acoustic wave device 1 has for example a substrate 3 (FIG. 2), a multilayer film 5 positioned on the substrate 3 (FIG. 2), an LT layer 7 positioned on the multilayer film 5, and a conductive layer 9 positioned on the LT layer 7. Each layer is for example given substantially a constant thickness in its plane. Note that, sometimes a combination of the substrate 3, multilayer film 5, and LT layer 7 will be referred to as a "fixed substrate 2" (FIG. 2).

In the acoustic wave device 1, an acoustic wave propagating through the LT layer 7 is excited by application of a voltage to the conductive layer 9. The acoustic wave device 1 for example configures a resonator and/or filter which utilizes this acoustic wave. The multilayer film 5 for example contributes to reflection of the acoustic wave and trapping of the energy of the acoustic wave in the LT layer 7. The substrate 3 for example contributes to reinforcement of the strengths of the multilayer film 5 and LT layer (Schematic Configuration of Fixed Substrate)

The substrate 3 has directly little influence upon the electrical characteristics of the acoustic wave device 1. Accordingly, the material and dimensions of the substrate 3 may be suitably set. The material of the substrate 3 is for example an insulating material. The insulating material is for example a resin or ceramic. Note that, the substrate 3 may be configured by a material having a lower thermal expansion coefficient compared with the LT layer 7 etc. as well. In this case, a possibility of change of the frequency characteristics of the acoustic wave device 1 due to a temperature change can be reduced. As such a material, for example there can be mentioned silicon or another semiconductor, a single crystal of sapphire or the like, and an aluminum oxide sintered body or other ceramic. Note that, the substrate 3 may be configured by stacking a plurality of layers which are made of materials different from each other as well. The thickness of the substrate 3 is for example greater than the LT layer 7. That is, the substrate 3 is provided with a thickness not less than 2p based on the later explained "p".

The multilayer film 5 is a structure which is positioned between the LT layer 7 and the substrate 3 and in which the total thickness of the layers (films) is not more than 2p based on the later explained "p". Further, the multilayer film 5 includes at least a low acoustic velocity film having a slower acoustic velocity than the acoustic velocity of a transverse wave propagating through the LT layer 7. Below, sometimes the transverse wave acoustic velocity will be simply referred to as the "acoustic velocity". Further, a value obtained by multiplying the thickness of the film by the density is calculated for each of the layers configuring the multilayer film 5. Among the thus obtained values, a difference is obtained by subtracting a value obtained by adding the values of the films having slower transverse wave acoustic velocities compared with the transverse wave acoustic velocity of the LT layer 7 to each other from a value obtained by adding the values of the films having faster transverse wave acoustic velocities compared with the transverse wave acoustic velocity of the LT layer 7 to each other. At this time, the thicknesses and materials of the layers are designed so that this difference becomes a negative value.

More specifically, when indicating (film thickness (unit: p), density (unit: kgcm$^{-3}$)), if defining a combination of film thicknesses and densities of high acoustic velocity films having faster acoustic velocities than the transverse wave acoustic velocity of the LT layer 7 as $(d_{h1}, \rho_{h1})$ $(d_{h2}, \rho_{h2})$ . . . , defining a combination of film thicknesses and densities of low acoustic velocity films as $(d_{L1}, \rho_{L1})$, $(d_{L2}, \rho_{L2})$ . . . , representing a total value of values obtained by multiplying the film thicknesses and the densities of the high acoustic velocity films by $S_H$, representing a total value of values obtained by multiplying the film thicknesses and the densities of low acoustic velocity films by $S_L$, and representing a differential value thereof by "D", the following equations stand:

$$S_H = d_{h1} \times \rho_{h1} + d_{h2} \times \rho_{h2} \ldots$$

$$S_L = d_{L1} \times \rho_{L1} + d_{L2} \times \rho_{L2} \ldots$$

$$D = S_H - S_L < 0$$

By configuring the multilayer film 5 satisfying such relationships, leakage of the acoustic wave is reduced, and a high Q-value can be realized.

Note that, the thicknesses and materials of the layers configuring the multilayer film 5, the stacked order, and the number of stacked layers etc. will be explained later.

The LT layer 7 is configured by a single crystal of lithium tantalate (LiTaO$_3$, LT). The cut angle of the LT layer 7 is not particularly limited. For example, it may be a 36° to 50° Y-rotated, and X-propagated substrate or may be (0°±10°, 0° to 55°, 0°±10°) in terms of the Euler angles.

Further, the thickness of the LT layer 7 is made relatively small. For example, it is less than 2p based on the later explained pitch "p". Further, it may be less than "p", more preferably may be 0.6p to 0.8p. By setting the cut angle and thickness of the LT layer 7 in this way, the acoustic wave can be trapped in the thin LT layer 7, therefore the Q-value can be raised. Further, it becomes also possible to utilize a wave having a vibration mode close to an SH mode or SV mode (slab mode) as the acoustic wave. As a result, it becomes possible to provide an acoustic wave device 1 which resonates at a high frequency with a relatively broad electrode finger pitch.

Further, when the thickness of the LT layer 7 is made less than 1p, the influence of a bulk wave spurious emission can be ignored in a usual bandwidth (for example, a bandwidth not more than 2500 MHz), therefore an acoustic wave device 1 having more excellent frequency characteristics can be provided.

(Schematic Configuration of Conductive Layer)

The conductive layer 9 is for example formed by a metal. The metal may be a suitable type. For example, it is aluminum (Al) or an alloy containing Al as a principal ingredient (Al alloy). The Al alloy is for example an aluminum-copper (Cu) alloy. Note that, the conductive layer 9 may be configured by a plurality of metal layers as well. For example, between the Al or Al alloy and the LT layer 7, a relatively thin layer comprised of titanium (Ti) for reinforcing their bondability may be provided as well.

The conductive layer 9 is formed so as to configure a resonator 15 in the example in FIG. 1. The resonator 15 is configured as a so-called 1-port acoustic wave resonator. When an electrical signal having a predetermined frequency is input from one of the conceptually and schematically shown terminals 17A and 17B, resonance is caused. A signal with resonance can be output from the other of the terminals 17A and 17B.

The conductive layer 9 (resonator 15) includes for example an IDT electrode 19 and a pair of reflectors 21 which are positioned on the two sides of the IDT electrode 19.

The IDT electrode 19 includes a pair of comb-shaped electrodes 23. Note that, in order to improve visual understanding, one comb-shaped electrode 23 is shown with hatching. The comb-shaped electrodes 23 for example include bus bars 25, pluralities of electrode fingers 27 extending from the bus bars 25 alongside each other, and dummy electrodes 29 each of which projecting from the bus bar 25 between two or more electrode fingers 27. The pair of comb-shaped electrodes 23 are arranged so that the pluralities of electrode fingers 27 intermesh (intersect) with each other.

The bus bars 25 are for example substantially formed in long shapes so as to linearly extend in the direction of propagation of the acoustic wave (D1 axis direction) with constant widths. Further, the pair of bus bars 25 face each other in a direction (D2 axis direction) perpendicular to the direction of propagation of the acoustic wave. Note that, the bus bars 25 may be changed in widths or be inclined relative to the direction of propagation of the acoustic wave.

The electrode fingers 27 are for example substantially formed in long shapes so as to linearly extend in the direction (D2 axis direction) perpendicular to the direction of propagation of the acoustic wave with constant widths. In each comb-shaped electrode 23, the plurality of electrode fingers 27 are arranged in the direction of propagation of the acoustic wave. Further, the plurality of electrode fingers 27 in one comb-shaped electrode 23 and the plurality of electrode fingers 27 in the other comb-shaped electrode 23 are basically alternately arranged.

A pitch "p" of the plurality of electrode fingers 27 (for example a distance between the centers of two mutually neighboring electrode fingers 27) is basically constant in the IDT electrode 19. Note that, parts of the IDT electrodes 19 may be provided with narrow pitch parts in which the pitch "p" becomes narrower than that in the other major parts and broad pitch parts in which the pitch "p" becomes broader than that in the other major parts. Such narrow pitch parts and broad pitch parts are for example limited to less than 10% of the entireties of the IDT electrodes 19.

Note that, below, when referring to the "pitch p", unless particularly indicated otherwise, it means the pitch of the parts (the major parts of the pluralities of electrode fingers 27) excluding the special parts such as the narrow pitch parts or broad pitch parts described above. Further, when the pitch changes even in the major parts of the pluralities of electrode fingers 27 excluding the special parts, a mean value of pitches of the major parts of the pluralities of electrode fingers 27 may be used as the value of the pitch "p".

The number of the electrode fingers 27 may be suitably set in accordance with the electrical characteristics etc. demanded from the resonator 15. Note that, FIG. 2 is a schematic view, therefore a smaller number of electrode fingers 27 are shown. In actuality, a larger number of electrode fingers 27 than those shown may be arranged. The same is true for the strip electrodes 33 in the reflector 21 which will be explained later.

The lengths of the pluralities of electrode fingers 27 are for example equal to each other. Note that, the IDT electrode 19 may be so-called apodized so as to change the lengths of the pluralities of electrode fingers 27 (from another viewpoint, intersecting widths) in accordance with the positions in the direction of propagation. The lengths and widths of the electrode fingers 27 may be suitably set in accordance with the demanded electrical characteristics etc.

The dummy electrodes 29 for example substantially project in a direction perpendicular to the direction of propagation of the acoustic wave with constant widths. The widths thereof are for example equal to the widths of the electrode fingers 27. Further, the plurality of dummy electrodes 29 are arranged by an equal pitch to that of the plurality of electrode fingers 27. The front end of a dummy electrode 29 in one comb-shaped electrode 23 faces the front end of an electrode finger 27 in the other comb-shaped electrode 23 across a gap. Note that, the IDT electrode 19 may be one not including dummy electrodes 29 as well.

The pair of reflectors 21 are positioned on the two sides of the plurality of IDT electrodes 19 in the direction of propagation of the acoustic wave. Each reflector 21 is for example made an electrically floating state or may be given the reference potential. Each reflector 21 is for example formed in a lattice shape. That is, the reflector 21 includes a mutually facing pair of bus bars 31 and pluralities of strip electrodes 33 extending between the pair of bus bars 31. The pitch of the plurality of strip electrodes 33 and the pitch of the mutually neighboring electrode finger 27 and strip electrode 33 are basically equal to the pitch of the plurality of electrode fingers 27.

Note that, although not particularly shown, the upper surface of the LT layer 7 may be covered by a protective film comprised of $SiO_2$, $Si_3N_4$, or the like from the top of the conductive layer 9 as well. The protective film may be a laminate of a plurality of layers comprised of these materials as well. The protective film may be one for simply suppressing corrosion of the conductive layer 9 or may be one contributing to temperature compensation. Where the protective film is provided or the like, on the upper surfaces or lower surfaces of the IDT electrode 19 and reflectors 21, additional films made of an insulator or metal may be provided as well in order to improve the reflection coefficient of the acoustic wave.

The configurations shown in FIG. 1 and FIG. 2 may be suitably packaged. The package may be for example one obtained by mounting the shown configuration on a not shown substrate so as to make the upper surface of the LT layer 7 face the substrate across a clearance and sealing it by resin from the top thereof or may be a wafer level package type providing a box type cover on the LT layer 7.

(Utilization of Acoustic Wave)

When a voltage is applied to the pair of comb-shaped electrodes 23, the voltage is applied to the LT layer 7 by the pluralities of electrode fingers 27, and the LT layer 7 being the piezoelectric body vibrates. Due to this, an acoustic wave propagating in the D1 axis direction is excited. The acoustic wave is reflected by the pluralities of electrode fingers 27. Further, a standing wave having the pitch "p" of the pluralities of electrode fingers 27 as substantially a half wavelength ($\lambda/2$) stands. The electrical signal generated in the LT layer 7 by the standing wave is extracted by the pluralities of electrode fingers 27. According to such a principle, the acoustic wave device 1 functions as a resonator which has the frequency of the acoustic wave having the pitch "p" as a half wavelength as the resonance frequency. Note that, $\lambda$ is usually a notation showing the wavelength. Further, the wavelength of an actual acoustic wave sometimes deviates from 2p. However, when use will be made of the notation of $\lambda$ in the following explanation, unless particularly explained, $\lambda$ means 2p.

Here, as explained above, the thickness of the LT layer 7 is made less than 2p, i.e., relatively thin. In this case, the acoustic wave propagating in the thickness direction can be reduced. As a result, an acoustic wave device 1 reduced in loss can be provided.

Here, as explained above, the thickness of the LT layer 7 is made less than 2p, i.e., relatively thin, therefore it becomes possible to utilize an acoustic wave of the slab mode or another mode having a faster propagation velocity than the propagation velocity of a general SAW (surface acoustic wave). For example, while the propagation velocity of the general SAW is 3000 to 4000 m/s, the propagation velocity of the acoustic wave in the slab mode is 10000 m/s or more. Accordingly, with a pitch "p" equal to the conventional one, resonance in a higher frequency region than the conventional one can be realized. For example, a resonance frequency of 5 GHz or more can be realized with a pitch "p" of 1 μm or more.

(Setting of Materials and Thicknesses of Layers)

The inventors of the present application performed simulations on the frequency characteristics of the acoustic wave device 1 while changing the materials and thicknesses of the multilayer film 5 and the thickness of the piezoelectric body layer (LT layer 7 in the present embodiment) in various ways.

As a result, by the thickness of the LT layer 7 becoming thinner than 1λ (2p), the frequency characteristics become easier to change by a change of the thickness of the LT layer 7. Further, the inventors found conditions of the multilayer film 5 enabling provision of an acoustic wave device 1 having a high robustness with respect to fluctuation of thickness of the LT layer 7. That is, they found conditions by which fluctuation of the resonance frequency (fr) and anti-resonance frequency (fa) was small and also by which the fluctuation of Δf (difference between the resonance frequency and the antiresonance frequency) could be small even if the thickness of the LT layer 7 fluctuated.

Specifically, this is as follows. Note that, in the following simulations, the various film thicknesses show values standardized by the pitch "p". The simulations were carried out by a pitch "p" of 2.7 μm. However, even if the pitch is changed, if changing the actual film thickness according to the pitch, similar results are obtained for the resonance characteristics except that the frequency dependency shifts as a whole.

(Materials of Multilayer Film)

First, simulations were carried out while changing the materials of the piezoelectric body layer (LT layer 7) and multilayer film 5 in various ways. As a result, the inventors found that, by using a single crystal of LT as the material of the piezoelectric body layer, using $SiO_2$ and $Ti_2O_5$ for low acoustic velocity films in the multilayer film 5 and using $Si_3N_4$ for high acoustic velocity films, resonance with the high Q-value and stable frequency characteristics even if the thickness of the LT layer 7 fluctuated could be realized.

FIG. 3A to FIG. 3C show examples of the results of such simulations. FIG. 3A shows the value of the resonance frequency with respect to the thickness of the LT layer 7, FIG. 3B shows the value of Δf with respect to the thickness of the LT layer 7, and FIG. 3C shows the Q-value with respect to the thickness of the LT layer 7. In these graphs, the abscissas show the thicknesses of the LT layers 7, the ordinates in FIG. 3A and FIG. 3B show the frequencies, and the ordinate in FIG. 3C shows the Q-value (unit: no dimension).

The conditions common to the simulations in FIG. 3 are as follows:

Piezoelectric Body Layer:
  Material: $LiTaO_3$
  Thickness: 0.4p to 1.0p
  Cut angle: 42°
Multilayer Film:
  Configuration: Multilayer structure of first low acoustic velocity film 11, first high acoustic velocity film 12, and second low acoustic velocity film 13 in order from LT layer 7 side (FIG. 2: below, this configuration will be sometimes referred to as the "basic configuration")
  Material:
    First low acoustic velocity film 11··$Ta_2O_5$
    First high acoustic velocity film 12··$Si_3N_4$
    Second low acoustic velocity film 13··$SiO_2$
  Thickness
    First low acoustic velocity film 11··0.019p
    First high acoustic velocity film 12··0.02p to 0.04p
    Second low acoustic velocity film 13··0.08p
Conductive Layer
  Material: Al
  Thickness: 0.08λ

In the multilayer film 5, various values were assumed for the thickness of the first low acoustic velocity film 11, the thickness of the first high acoustic velocity film 12, and the thickness of the second low acoustic velocity film 13 for conducting simulations. That is, simulations were actually carried out for more than the three cases shown in FIGS. 3A to 3C. Note that, FIGS. 3A to 3C show the results of simulations in a case where the film thicknesses of the first low acoustic velocity film 11 and second low acoustic velocity film 13 were made constant and the film thickness of the first high acoustic velocity film 12 was changed in three stages.

As a result, it was confirmed that, the resonance frequency fr became higher if making the thickness of the film of the multilayer film having a high acoustic velocity greater and the resonance frequency fr became lower if making the film having a low acoustic velocity thicker. Further, both of the variation of fr due to the ratio of the thicknesses of the layers configuring the multilayer film and the variation of fr due to the thickness of the LT layer greatly fluctuated depending on the combination of the thicknesses of the layers configuring the multilayer film. It was confirmed also from this fact that the thicknesses of the layers configuring the multilayer film had to be balanced.

Further, as indicated by a broken line in FIG. 3A, it could be confirmed that the resonance frequency fr fluctuated according to the thickness of the LT layer 7, but there was a multilayer film configuration having stable frequency characteristics. Specifically, stable frequency characteristics with respect to the fluctuation of thickness of the LT layer are realized in a configuration of a multilayer film having thicknesses of the first low acoustic velocity film 11, first high acoustic velocity film 12, and second low acoustic velocity film 13 of 0.019p, 0.02p, and 0.08p in that order. In particular, stable frequency characteristics can be realized when the thickness of the LT layer is 0.6p to 0.8p.

Note that, as shown in FIG. 3B, in the same thickness range of the LT layer with the multilayer film having the above configuration, Δf is stable without change. Further, as shown in FIG. 3C, a high Q-value can be stably obtained within the same thickness range of the LT layer with the multilayer film with the above configuration. In particular, a tendency toward a drop in the Q-value is confirmed when the thickness of the LT layer 7 exceeds 0.8p. From this viewpoint, the thickness of the LT layer 7 may be made 0.8p or less.

Further, as apparent from FIG. 3A, when combining the thicknesses explained above, even if the thicknesses of the layers configuring the multilayer film are changed with the same thickness range of the LT layer, relatively close resonance frequencies fr are obtained. It was confirmed from this fact that robustness was provided not only in the thickness of the LT layer, but also in the thicknesses of the layers configuring the multilayer film.

Figure 4:
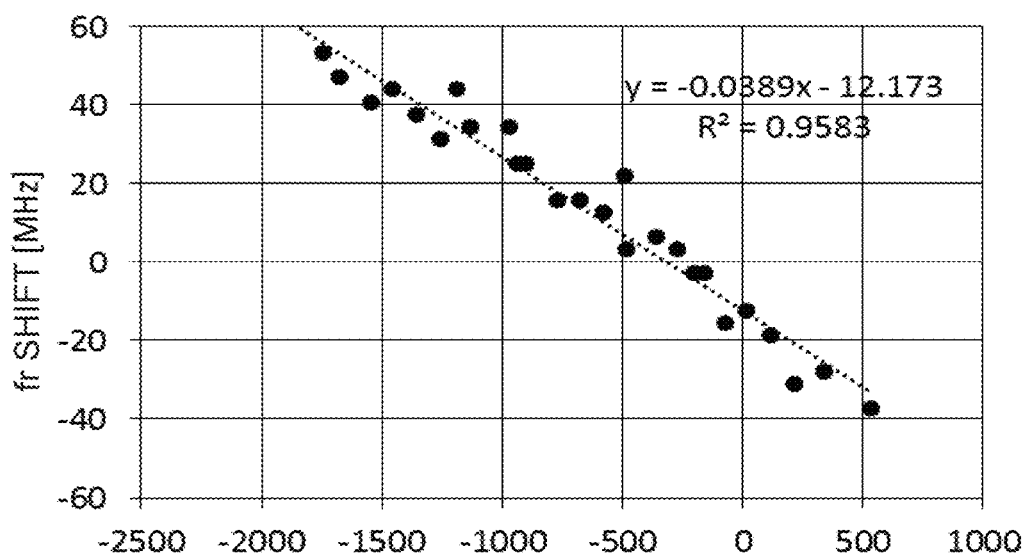
FIG. 4 is a graph showing the results of simulation in the basic configuration.

FIG. 4 shows the relationships between the differential value D and the amount of fr shift at the time when the order of stacking is not changed, but the thicknesses of the layers are made different in the above multilayer film configuration. The relationships of the transverse wave acoustic velocities and the densities in the LT layer, first low acoustic velocity film 11, first high acoustic velocity film 12, and second low acoustic velocity film 13 are (4214,7460), (2856, 7760), (5961,3200), and (3740,2200) in that order in terms of (acoustic velocity (m/s), density (kg/cm$^3$)).

As apparent from FIG. 4, there is a correlation between the differential value D and the amount of fr shift. The amount of fr shift can be made ±5 MHz or less when the differential value D is −441 to −184.

The thicknesses of the first low acoustic velocity film 11, first high acoustic velocity film 12, and second low acoustic velocity film 13 enabling realization of such a differential value D become 0.001p to 0.04p, 0.01p to 0.045p, and 0.042p to 0.15p in that order. In the case of the simulations explained above, in particular the combination enabling acquisition of an acoustic wave element which has a high Q-value and is excellent in robustness, that is, the case where the thicknesses of the first low acoustic velocity film 11, first high acoustic velocity film 12, and second low acoustic velocity film 13 are 0.019p, 0.02p, and 0.08p in that order, the D-value becomes as follows:

$$D=S_H-S_L=(3200\times0.02)-(7760\times0.019+2200\times0.08)=-259.44$$

Note that, the total of the thicknesses of the multilayer film realizing the differential value D may be made 1p or less combined with the LT layer. This is because, in this case, the multilayer film has a greater influence upon the acoustic wave, therefore the influence of the multilayer film structure becomes stronger. Further, by formation with such thicknesses, even in a case where a slab mode acoustic wave is used, the effects of the multilayer film raising the Q-value and robustness can be more effectively manifested.

Here, in the multilayer film, the correlation between the differential value D and the amount of fr shift was measured while making the stacking order and materials of the layers different. As a result, in any configuration, the larger the differential value D in the positive direction, the larger the amount of shift in the negative direction. In addition, the differential value D making the amount of shift zero became a negative value. From the above explanation, the thicknesses and materials of the layers may be selected so as to make the differential value D negative.

Figure 5:
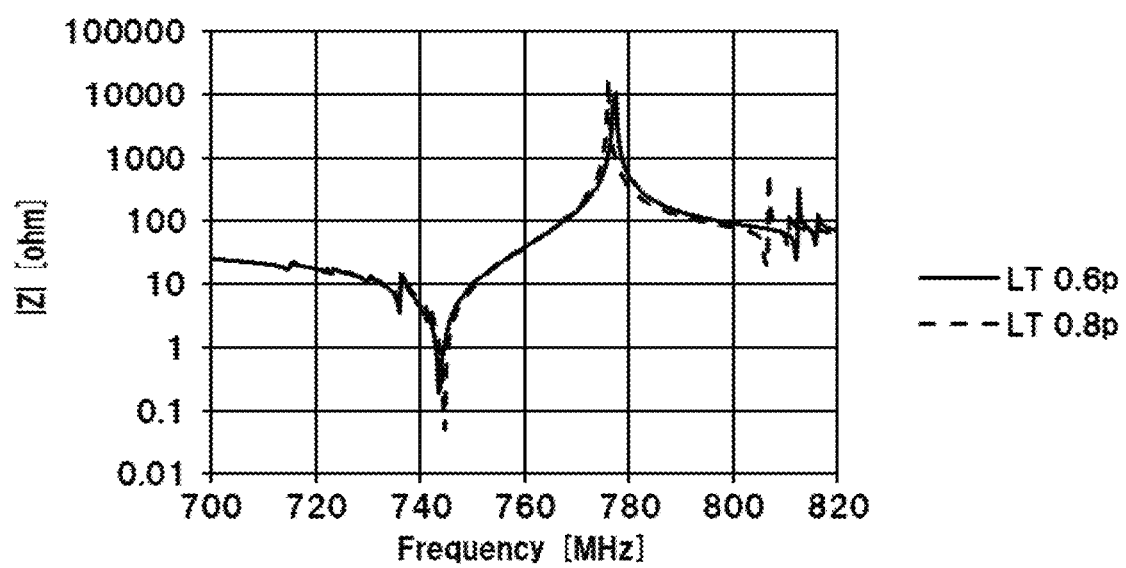
FIG. 5 is a graph showing frequency characteristics in the basic configuration.

As explained above, FIG. 5 shows the results of measurement of the frequency characteristics of the acoustic wave device 1 in a case where the thicknesses of the first low acoustic velocity film 11, first high acoustic velocity film 12, and second low acoustic velocity film 13 are made 0.019p, 0.02p, and 0.08p in that order so that the D-value becomes a negative value. In FIG. 5, the abscissa shows the frequency, the ordinate shows the absolute value of impedance, a solid line indicates the characteristics where the thickness of the LT layer is 0.6p, and the broken line indicates the characteristics in the case of 0.8p. As apparent also from this graph, it was confirmed that, a large frequency shift does not occur in either the resonance frequency or the antiresonance frequency even if the thickness of the LT layer fluctuated by 0.2p, and an acoustic wave device excellent in robustness could be provided.

Figure 6:
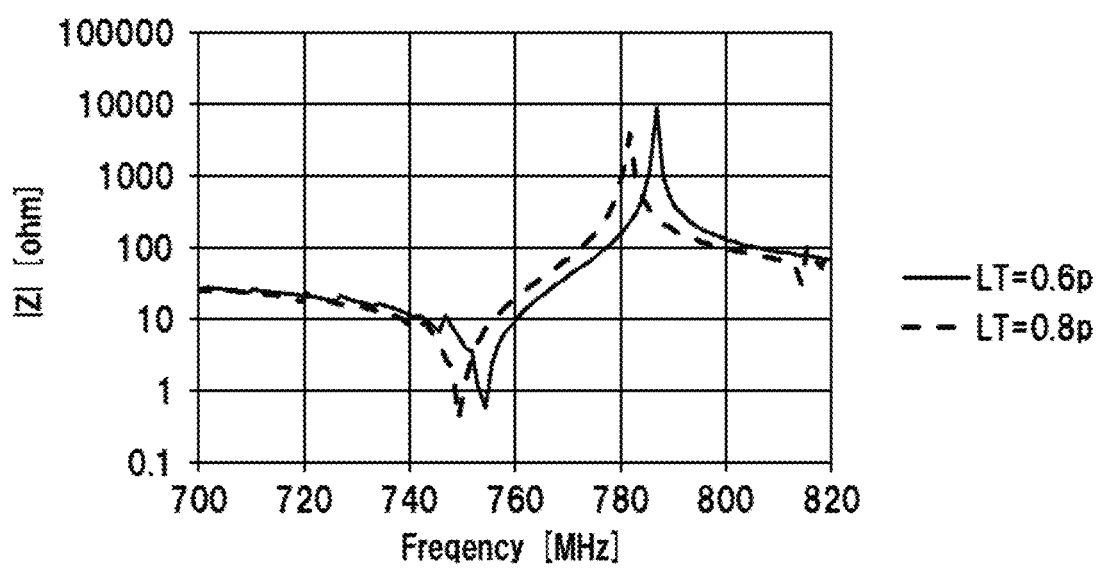
FIG. 6 is a graph showing the frequency characteristics of an acoustic wave device according to a comparative example.

Further, as a comparative example, FIG. 6 shows the results of measurement of the frequency characteristics in the same way for a case where no multilayer film is interposed. According to the acoustic wave device of the comparative example, it could be confirmed that the frequency characteristics changed due to the change of the thickness of the LT layer, therefore stable frequency characteristics were not obtained.

Figure 7A:
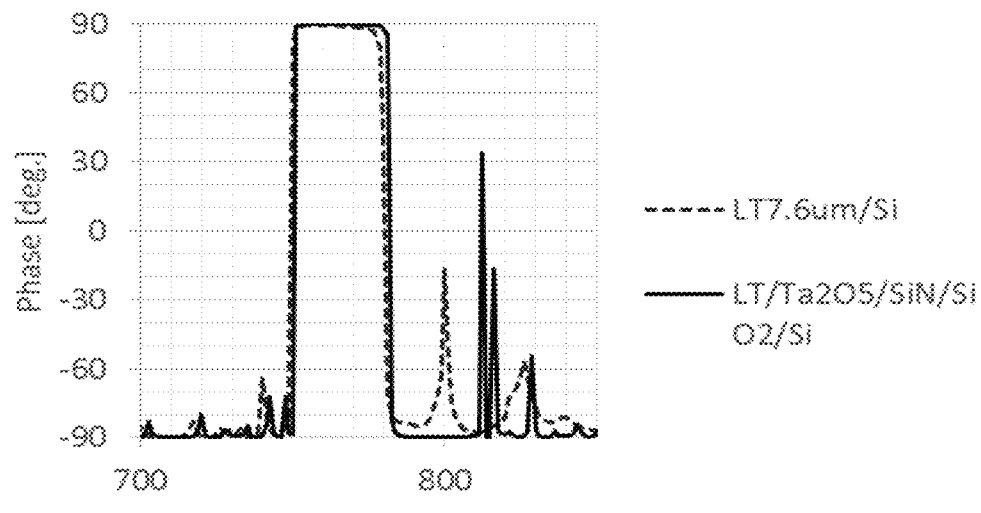
FIG. 7A, FIG. 7B, and FIG. 7C are graphs which respectively show phase characteristics in the basic configuration and the acoustic wave device according to the comparative example.
Figure 7B:
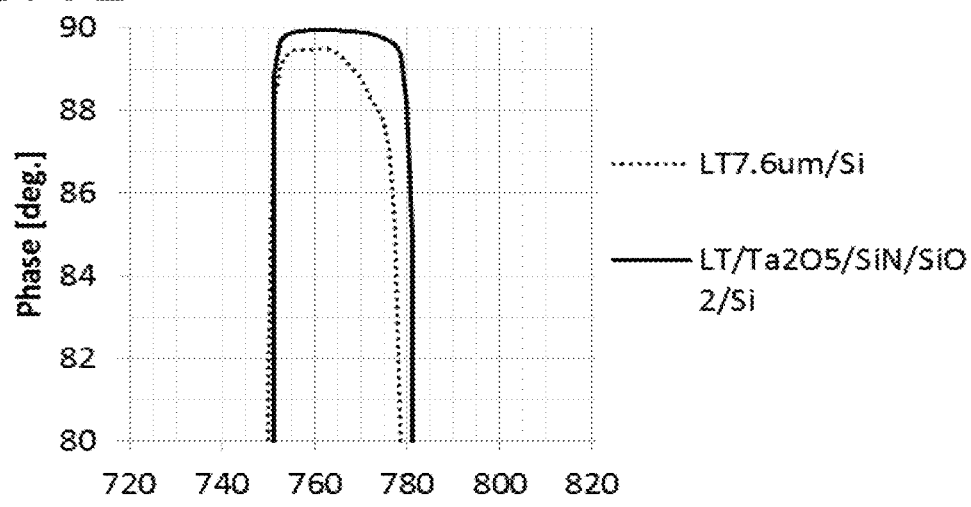
Figure 7C:
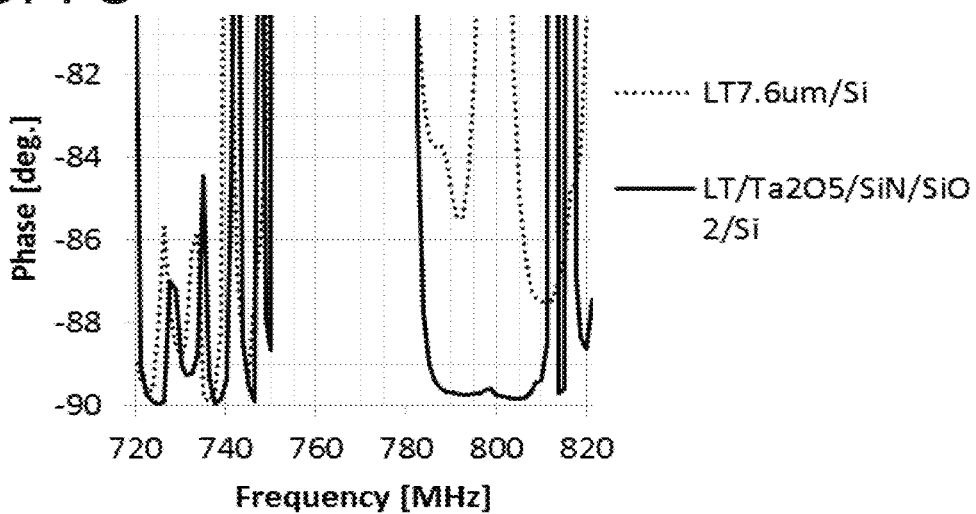

Further, FIGS. 7A to 7C show phase characteristics of the acoustic wave element of the model shown in FIG. 5 (basic configuration) and the acoustic wave element according to the comparative example when the thicknesses of the LT layers 7 are made the same. In FIGS. 7A to 7C, the abscissas indicate the frequencies, and the ordinates indicate the phases (unit: deg). They show that the loss is smaller as the phase becomes closer to 90° or −90°. Note that, FIG. 7A shows the characteristics in a broad frequency range, FIG. 7B shows the phase characteristics in a frequency band between the resonance frequency and the antiresonance frequency, and FIG. 7C shows the phase characteristics near −90° on the side of a higher frequency than the antiresonance frequency.

As apparent also from FIGS. 7A to 7C, it was confirmed that the loss in the acoustic wave device having the basic configuration was small even in the frequency band between the resonance frequency and the antiresonance frequency and in the frequency band on the side of a higher frequency than the antiresonance frequency.

(Verification: Substrate 3)

Note that, the examples explained above show a configuration providing the multilayer film 5 to thereby trap the acoustic wave in the LT layer 7, therefore the substrate 3 can be relatively freely selected. Further, when using Si as the substrate 3, since the acoustic velocity of Si is 9620 m/s and is faster compared with the LT layer 7, the tendency of the characteristic on the low acoustic velocity side in the multilayer film 5 being strong can be eased at a position separate from the LT layer 7.

(Other Multilayer Film Configurations)

The inventors of the present application assumed various values for the number of the layers configuring the multilayer film, the materials and thicknesses of the layers, and the stacking order and performed computer simulations for the frequency characteristics of the acoustic wave device 1. As a result, they found ranges of the values of various parameters providing good Q-values and robustness.

Below, combinations of the values of parameters enabling acquisition of relatively good characteristics will be explained first. Next, using this combinations as the centers (standards), the changes of the characteristics when changing the various types of parameters will be explained. Together with this, examples of ranges of the values of the various parameters will be explained. Note that, the ranges which will be explained below are just examples of the preferred ranges. Naturally, values of various parameters may be set beyond these ranges.

(Values of Standard Parameters)

As described above, as a result of computer simulations, in the configurations other than the basic configuration explained above, Model 1, Model 2, and Model 3 exhibiting relatively good frequency characteristics were obtained.

Figure 8A:
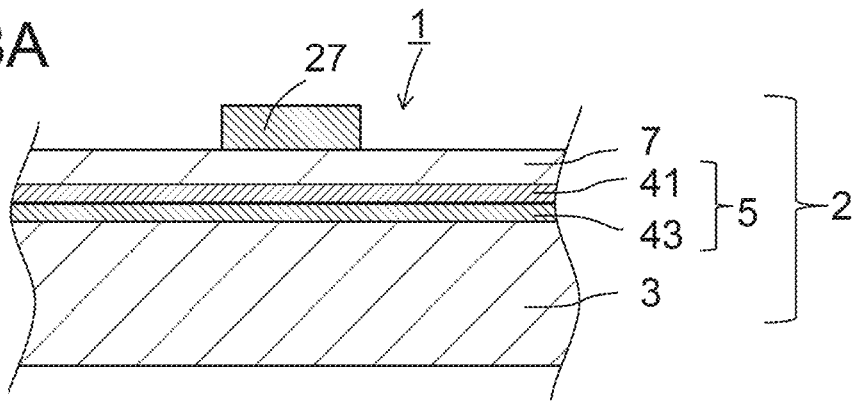
FIG. 8A, FIG. 8B, and FIG. 8C are schematic cross-sectional views showing the configurations of fixed substrates in Model 1 to Model 3.
Figure 8B:
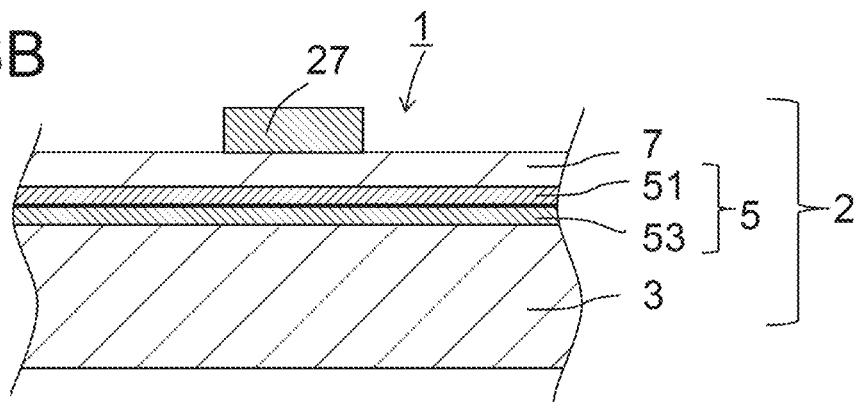
Figure 8C:
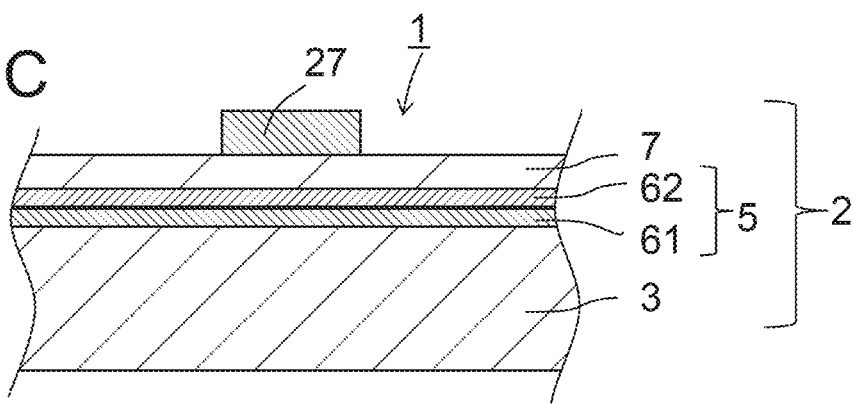

FIG. 8A, FIG. 8B, and FIG. 8C respectively show schematic cross-sectional views of fixed substrates of Model 1, Model 2, and Model 3. The configurations of the models will be explained with reference to these drawings.

Model 1:

The multilayer film is formed by stacking a first low acoustic velocity film 41 and a second low acoustic velocity film 43 in that order from the LT layer 7 side.

Material:
First low acoustic velocity film 41: $Ta_2O_5$
Second low acoustic velocity film 43: $SiO_2$
Thickness:
First low acoustic velocity film 41: 0.029p
Second low acoustic velocity film 43: 0.028p
Thickness of LT layer: 0.74p Model 2:

The multilayer film is formed by stacking a first low acoustic velocity film 51 and a second low acoustic velocity film 53 in that order from the LT layer 7 side.

Material
First low acoustic velocity film 51: $SiO_2$
Second low acoustic velocity film 53: $Ta_2O_5$
Thickness
First low acoustic velocity film 51: 0.068p
Second low acoustic velocity film 53: 0.019p
Thickness of LT layer: 0.64p Model 3:

The multilayer film is formed by stacking a first high acoustic velocity film 62 and a first low acoustic velocity film 61 in that order from the LT layer 7 side.

Material
First high acoustic velocity film 62: $Si_3N_4$
First low acoustic velocity film 61: $Ta_2O_5$
Thickness
First high acoustic velocity film 62: 0.052p
First low acoustic velocity film 61: 0.1p
Thickness of LT layer: 0.65p In Models 1 to 3, it was confirmed that all of the resonance characteristics, Q-values, and robustnesses were good. Further, for Models 1 to 3, in the same way as FIG. 4, the amount of fr shifts at the time when the layer configurations were not changed, but the thicknesses of the layers were changed and thereby the differential values D were made different were simulated. The results thereof are respectively shown in FIG. 9, FIG. 10, and FIG. 11.

Figure 9:
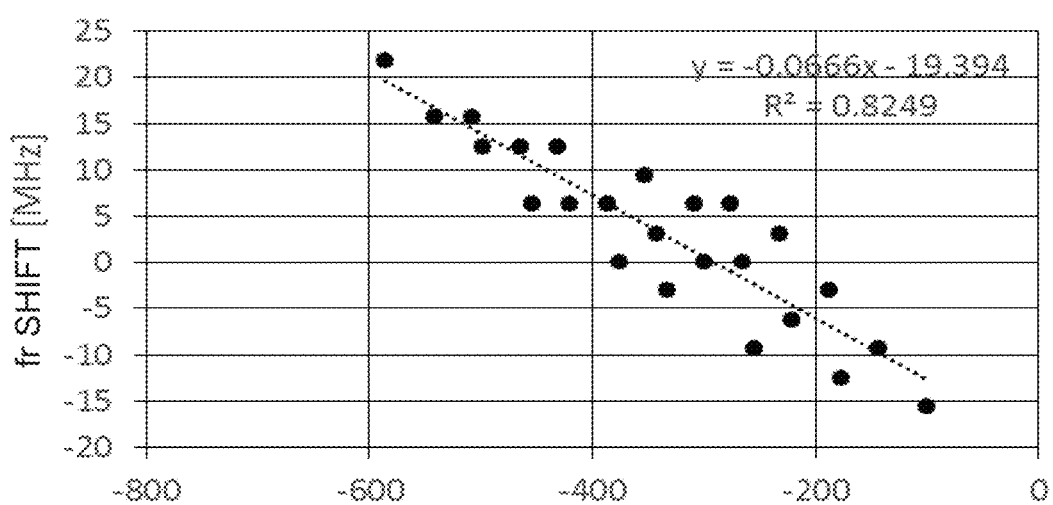
FIG. 9 is a graph showing the result of simulation of Model 1.
Figure 10:
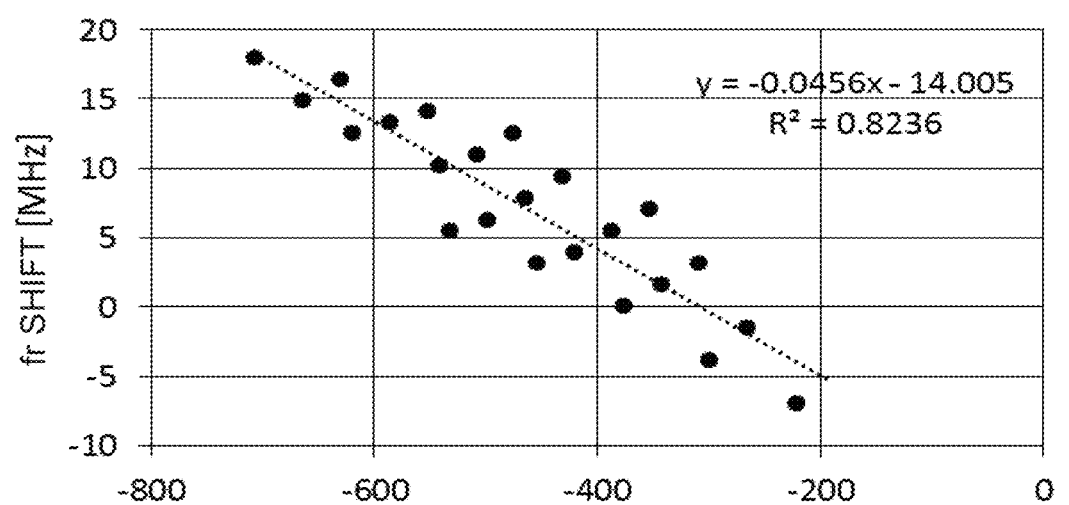
FIG. 10 is a graph showing the result of simulation of Model 2.
Figure 11:
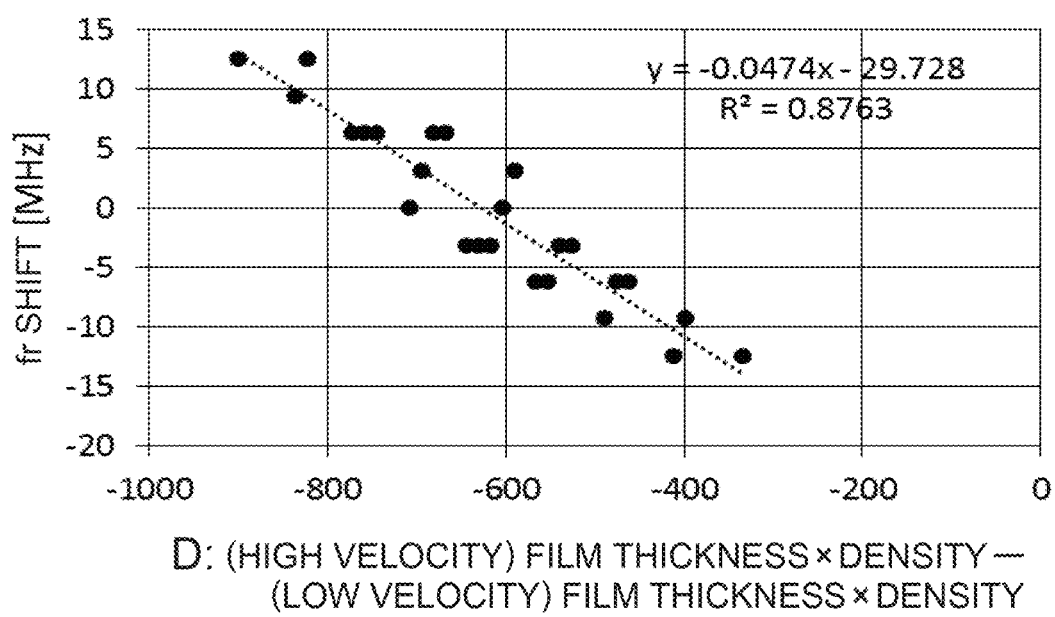
FIG. 11 is a graph showing the result of simulation of Model 3.

As apparent also from FIGS. 9 to 11, it was confirmed that there was a high correlation between the D-value and the amount of fr shift in all models and that the amount of shift could be controlled to within ±5 MHz in all models when the differential value D was made a negative value.

Specifically, in the case of Model 1, the amount of shift can be controlled to within ±5 MHz when the differential value D is made −366 to −216. The ranges of the thicknesses of the first low acoustic velocity film 41 and the second low acoustic velocity film 43 realizing such a value are 0.021p to 0.037p and 0.015p to 0.04p in that order. Note that, in Model 1, both of fr and Δf were stable with respect to a fluctuation of thickness of the LT layer. Further, it was confirmed that a high value of the Q-value was also stably maintained.

In the case of Model 2, when the differential value D is made −417 to −197, the amount of shift can be controlled to within ±5 MHz. The ranges of the thicknesses of the first low acoustic velocity film 51 and the second low acoustic velocity film 53 realizing such a value are 0.054p to 0.082p and 0.029p to 0.048p in that order. Note that, in Model 2, particularly fr was stable with respect to a fluctuation of thickness of the LT layer. Further, in Model 2, Δf became larger compared with Model 1.

In the case of Model 3, when the differential value D is made −732 to −521, the amount of shift can be controlled to within ±5 MHz. The ranges of the thicknesses of the first high acoustic velocity film 62 and the first low acoustic velocity film 61 realizing such a value are 0.039p to 0.064p and 0.089p to 0.11p in that order. Note that, in Model 3, both of fr and Δf were stable with respect to a fluctuation of thickness of the LT layer.

Note that, the results of simulations of tolerances from the representative values of the thicknesses of the layers of the models for the basic configuration and Models 1 to 3 will be shown in FIG. 12. The tolerances were the thickness ranges which could make the change of the resonance frequency fr less than ±1 MHz and make the change of Δf less than ±0.5 MHz.

As apparent also from FIG. 12, in all of the models, realization of a tolerance of the LT layer not less than 5% was confirmed. In particular, for Model 3, it was confirmed that the tolerance of the LT layer could be controlled to 20% or more, therefore an acoustic wave element having a high robustness could be realized.

Further, it was confirmed that also the tolerances of the thicknesses of the layers configuring the multilayer film exceeded 10% and the tolerances of the thicknesses of all layers exceeded 20% for Models 1 and 2, therefore an acoustic wave element having a high robustness could be realized. The thicknesses of the layers configuring the multilayer film are very thin, therefore the productivity can be raised due the high robustness relative to the thicknesses of layers.

Note that, in FIG. 12, the results of the same computation performed for the configuration disclosed in Patent Literature 1 International Patent Publication No. 2012/086639 are added as reference example. Specifically, the results of simulations for a configuration forming the $SiO_2$ layer and AlN layer with thicknesses of 0.0175p and 0.5p in order from the LT layer side were arranged. The acoustic velocity and density of AlN are 6426 m/s and 3260 $kg/cm^3$. Accordingly, the D-value is 1630, i.e., takes a positive value. In this configuration, no combination of the total thicknesses capable of reducing changes of fr and Δf with respect to the change of the thickness of the LT layer could be found. Further, the tolerances of the LT layer and the $SiO_2$ layer became less than 5% and less than 10%.

From the above, it was confirmed that according to the acoustic wave device 1 using the fixed substrate 2 in the present disclosure, the device could be given a high Q-value and high robustness.

Note that, in the examples explained above, the case where the multilayer film 5 and the substrate 3 were directly bonded was explained. However, an intermediate layer may be present between the two as well. The thickness of the intermediate layer is set to a thickness within a range exerting no influence upon the function of the multilayer film. The thickness thereof may be for example made less than 0.01p or less than 5 nm. The intermediate layer may function as a connection reinforcing layer, may function as a heat radiation layer, or may function as an unwanted wave reduction layer which absorbs only a bulk wave. The unwanted wave reduction layer is configured by a low resistance layer.

For a case where such a low resistance layer was arranged between the multilayer film 5 and the substrate 3, the same simulations as those in the examples explained above were carried out for the frequency characteristics etc. of the acoustic wave device.

As the low resistance layer, the thickness was made 2 nm, and the resistivity was made 0.018 Ω·cm. For such a thickness and resistivity, for example, a dopant may be injected into the surface on the multilayer film side in the Si substrate to realize a desired resistivity by the concentration of that dopant. Otherwise, they may be realized by forming a layer adjusted in quantities of various types of metals such as Fe, Ni, Ta, and Li.

By providing such a low resistance layer, the strength of the bulk wave spurious emission becomes lower, therefore the influence can be reduced. On the other hand, there is a possibility of occurrence of loss of the acoustic wave. Therefore, the explanation will be given of a combination of the values of the parameters with which relatively good characteristics were obtained in order to reduce the loss. Next, using this combination as the center (standard), changes of the characteristics when changing various parameters will be explained. Together with this, examples of preferred ranges of the values of the various parameters will be explained. Note that, the ranges which will be explained below are just examples of the preferred ranges. Naturally, the values of various parameters can be set beyond these ranges as well.

As described above, as a result of simulations and computations, with the configurations other than the basic configuration explained above, Model 4 to Model 7 showing relatively good frequency characteristics were obtained. FIG. 15 shows the results by performing simulations for Models 4 to 7 and summarizing the robustnesses thereof.

Models 4 to 7 are as follows:

Model 4:
This is formed by the following layers being arranged in this order from the LT layer 7 side.
AlN layer: Thickness of 0.2p
$Ta_2O_5$ layer: Thickness of 0.297p
Thickness of LT layer: 0.683p Model 5:
This is formed by the following layers being arranged in this order from the LT layer 7 side:
$SiO_2$ layer: Thickness of 0.366p
$Ta_2O_5$ layer: Thickness of 0.04p
Thickness of LT layer: 0.706p Model 6:
This is formed by the following layers being arranged in this order from the LT layer 7 side:
$Ta_2O_5$ layer: Thickness of 0.101p
$Si_3N_4$ layer: Thickness of 0.316p
$SiO_2$ layer: Thickness of 0.234p
Thickness of LT layer: 0.650p Model 7:
This is formed by the following layers being arranged in this order from the LT layer 7 side:
$Ta_2O_5$ layer: Thickness of 0.099p
$Si_3N_4$ layer: Thickness of 0.6p
AlN layer: Thickness of 0.775p
Thickness of LT layer: 0.650p As a result of simulations, in all of Models 4 to 7, either of the robustness of the LT layer being 5% or more or the robustness of the thickness of each of the layers in the multilayer film being 10% or more is realized. In the LT layer 7, formation of thinner layer and control of film thickness are difficult, therefore the productivity can be raised by raising the robustness of the LT layer. On the other hand, each of the layers configuring the multilayer film 5 has a further smaller thickness than the LT layer 7, therefore it is desired to make the tolerance larger.

Note that, in Model 5, the robustness of the thickness of the LT layer is 4%. That is, a robustness equal to that in the reference example can be realized by a multilayer film which is thinner than that in the reference example.

Here, in Models 4 to 6, the differential value D becomes a negative value. However, in Model 7, the differential value D becomes a positive value. The reason for this is guessed to be that the thickness of the multilayer film in Model 7 becomes larger than the other models and the mechanism changes.

That is, it is guessed that when the total thickness of the multilayer film is less than 1p, an acoustic wave device having a high robustness and high Q-value can be provided by making the differential value D a negative value.

Note that, in the examples explained above, the case where the intermediate layer (low resistance layer) was provided between the multilayer film 5 and the substrate 3 was explained. However, in the same way, an intermediate layer may be positioned between the LT layer and the multilayer film 5 as well.

(Method for Manufacturing Acoustic Wave Device)

The acoustic wave device 1 may be manufactured by combining various known manufacturing processes. For example, a wafer forming the substrate 3 is processed by a CVD (chemical vapor deposition) or other thin film forming method to form a low acoustic velocity film and/or a high acoustic velocity film sequentially. Note that, when the substrate 3 is made of Si and a layer in the multilayer film 5 which is positioned on the side closest to the substrate 3 is the $SiO_2$ layer, this layer may be formed by thermal oxidation as well. On the other hand, a wafer forming the LT layer 7 is prepared according to the same preparation process as that for the wafer of a general LT substrate. The wafer forming the LT layer 7 is bonded to the wafer forming the substrate 3 and multilayer film 5. In the bonding, the LT layer 7 is made to directly abut against the uppermost layer of the multilayer film 5. Heat treatment or the like may be carried out before or after the abutting process as well. After that, the metal layer which becomes the conductive layer 9 is formed and patterned on the upper surface of the wafer forming the LT layer 7, and the wafer is diced. Due to this, the acoustic wave device 1 is prepared. Naturally a suitable process may be added in accordance with the form of the package etc.

(Example of Utilization of Acoustic Wave Device: Multiplexer)

Figure 13:
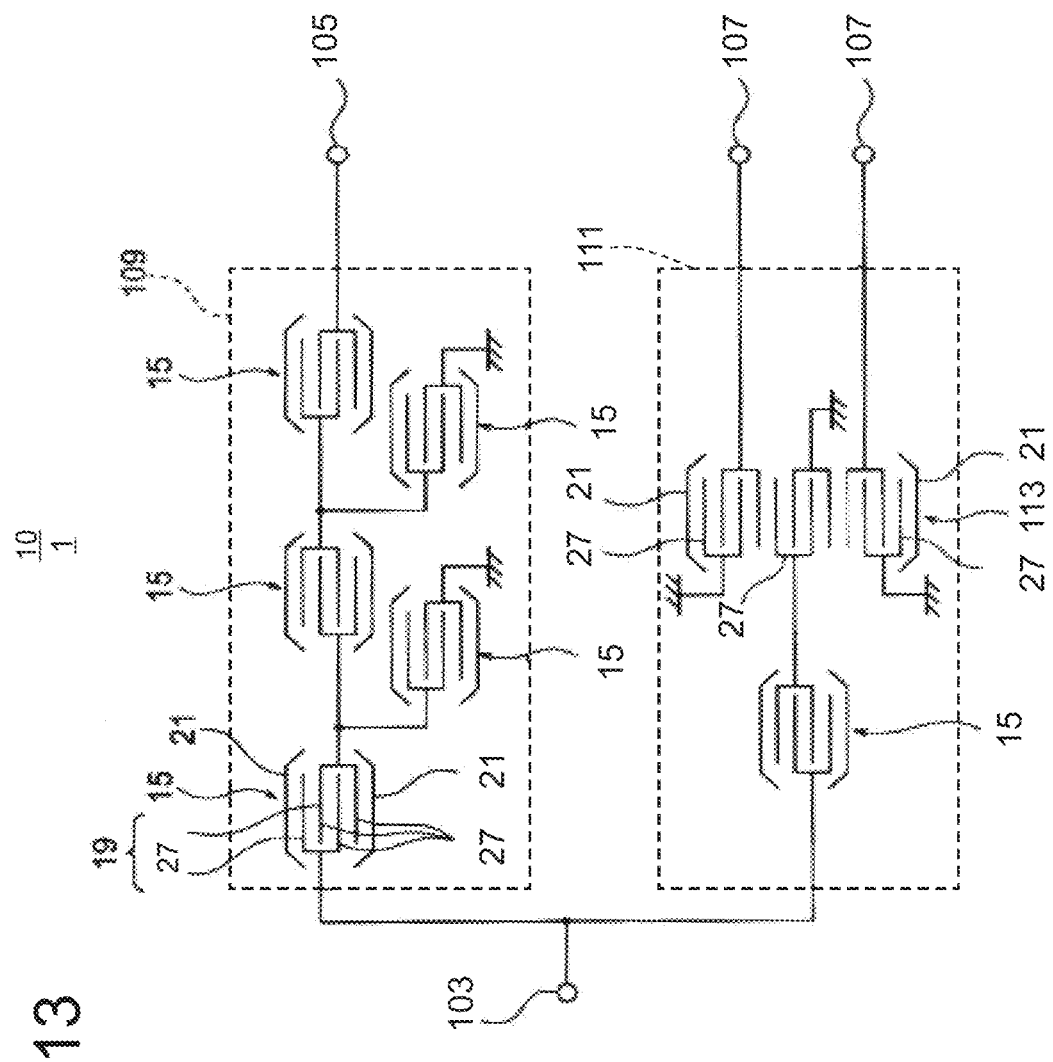
FIG. 13 is a circuit diagram schematically showing the configuration of a multiplexer as an example of utilization of the acoustic wave device in FIG. 1.

FIG. 13 is a circuit diagram schematically showing the configuration of a multiplexer 101 as an example of utilization of the acoustic wave device 1. As understood from the notation shown at the top left of the drawing sheet in this diagram, the comb-shaped electrodes 23 are schematically shown by two-prong fork shapes and the reflector 21 is represented by one line bent in the two ends in this diagram.

The multiplexer 101 for example has a transmission filter 109 which filters a transmission signal from a transmission terminal 105 and outputs the result to an antenna terminal 103 and has a reception filter 111 which filters a reception signal from the antenna 103 and outputs the result to a pair of reception terminals 107.

The transmission filter 109 is for example configured by a ladder type filter configured by a plurality of resonators 15 connected in a ladder shape. That is, the transmission filter 109 has a plurality of (may be one) resonators 15 which are connected in series between the transmission terminal 105 and the antenna terminal 103 and a plurality of (may be one) resonators 15 (parallel arm) which connect the above serial line (serial arm) and the reference potential. Note that, the pluralities of resonators 15 configuring the transmission filter 109 are for example provided on the same fixed substrate 2 (3, 5, and 7).

The reception filter 111 is for example configured including a resonator 15 and a multimode type filter (including a double mode type filter) 113. The multimode type filter 113 has a plurality of (three in the example shown) IDT electrodes 19 which are arranged in the direction of propagation of the acoustic wave and a pair of reflectors 21 which are arranged on the two sides thereof. Note that, the resonator 15 and multimode type filter 113 configuring the reception filter 111 are for example provided on the same fixed substrate 2.

Note that, the transmission filter 109 and the reception filter 111 may be provided on the same fixed substrate 2 or may be provided on fixed substrates 2 which are different from each other. FIG. 13 is just one example of the configuration of the multiplexer 101. For example, the reception filter 111 may be configured by a ladder type filter in the same way as the transmission filter 109 as well.

Note that, the case where the multiplexer 101 was provided with the transmission filter 109 and the reception filter 111 was explained. However, the present disclosure is not limited to this. For example, it may be a diplexer or may be a multiplexer including three or more filters.

(Example of Utilization of Acoustic Wave Device: Communication Apparatus)

Figure 14:
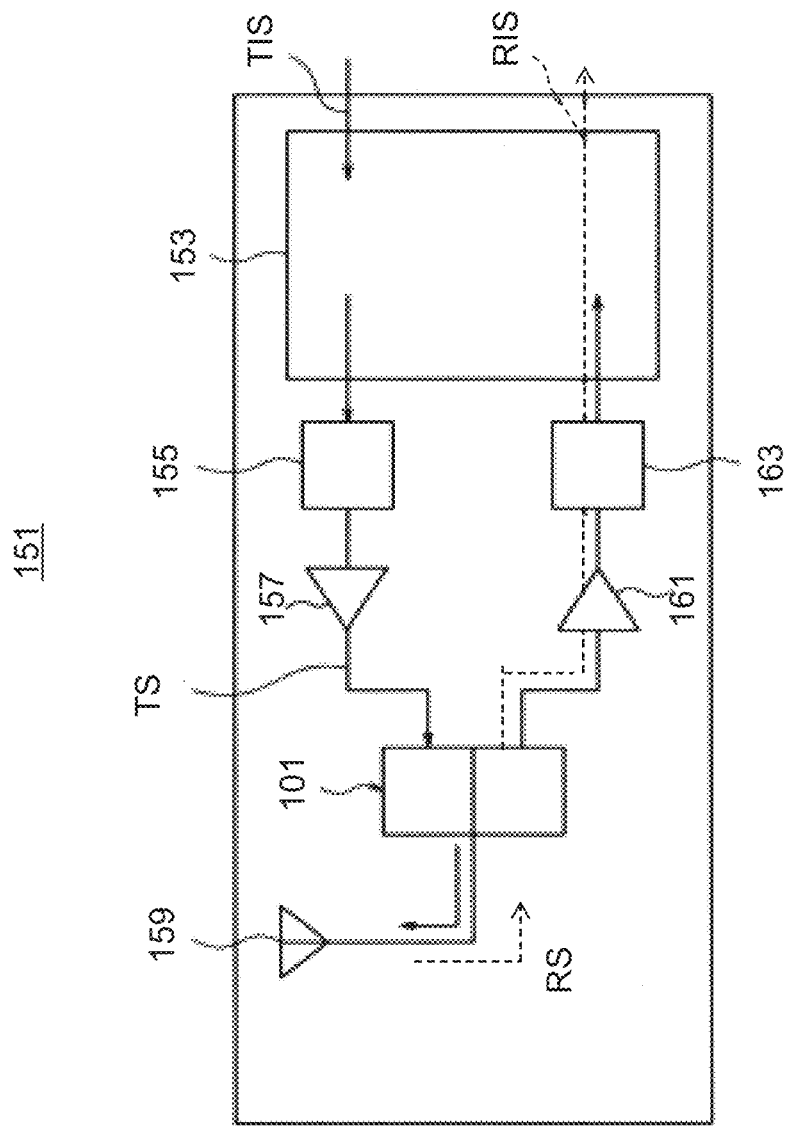
FIG. 14 is a circuit diagram schematically showing the configuration of a communication apparatus as an example of utilization of the acoustic wave device in FIG. 1.

FIG. 14 is a block diagram showing the principal part in a communication apparatus 151 as an example of utilization of the acoustic wave device 1 (multiplexer 101). The communication apparatus 151 performs wireless communication utilizing radio waves and includes the multiplexer 101. The communication apparatus 151 includes an antenna 159, a multiplexer 101 electrically connected with the antenna 159, and an IC (RF-IC etc. which will be explained later) which is connected with respect to the transmission filter 109 and reception filter 111 on the side opposite to the antenna 159 when viewed in a signal route.

In the communication apparatus 151, a transmission information signal TIS including information to be transmitted is modulated and raised in frequency (conversion to a high frequency signal having a carrier frequency) by an RF-IC (radio frequency integrated circuit) 153 to become a transmission signal TS. The transmission signal TS is stripped of unwanted components other than the transmission-use passing band by a band pass filter 155, is amplified by an amplifier 157, and is input to the multiplexer 101 (transmission terminal 105). Further, the multiplexer 101 (transmission filter 109) strips the unwanted components other than the transmission-use passing band from the input transmission signal TS and outputs the transmission signal TS after stripping from the antenna terminal 103 to the antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the multiplexer 101 (antenna terminal 103). The multiplexer 101 (reception filter 111) strips the unwanted components other than the reception-use passing band from the input reception signal RS and outputs the result from the reception terminal 107 to an amplifier 161. The output reception signal RS is amplified by the amplifier 161 and is stripped of unwanted components other than the reception-use passing band by the band pass filter 163. Further, the reception signal RS is boosted down in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digital audio signals. The passing band of the wireless signal may be suitably set. In the present embodiment, also a passing band of relatively high frequency (for example 5 GHz or more) is possible. The modulation scheme may be either of phase modulation, amplitude modulation, frequency modulation, or a combination of any two or more among them. As the circuit system, FIG. 14 illustrated a direct conversion system. However, a suitable system other than that may be employed. For example, it may be a double superheterodyne system as well. Further, FIG. 14 schematically shows only the principal part. A low pass filter or isolator etc. may be added to suitable positions. Further, the positions of the amplifier etc. may be changed as well.

The present invention is not limited to the above embodiments and may be executed in various ways. For example, the thicknesses of the layers and the Euler angles of the LT layer may be made values outside of the ranges exemplified in the embodiments as well.

REFERENCE SIGNS LIST

1 . . . acoustic wave device, 3 . . . substrate, 5 . . . multilayer film, 7 . . . LT layer, and 19 . . . IDT electrode.

The invention claimed is:

1. An acoustic wave device comprising:
a substrate,
a multilayer film on the substrate,
an LT layer which is located on the multilayer film and is configured by a single crystal of $LiTaO_3$, and
an IDT electrode on the LT layer, wherein,
in the multilayer film, a differential value is negative, the differential value being obtained by subtracting a total value of values each obtained by multiplying a density and thickness of a film having a slower acoustic velocity than a transverse wave acoustic velocity of the LT layer from a total value of values each obtained by multiplying a density and thickness of a film having a faster acoustic velocity than the transverse wave acoustic velocity of the LT layer, and
a total thickness of the LT layer and the multilayer film is less than p where a pitch of electrode fingers in the IDT electrode is "p".

2. The acoustic wave device according to claim 1, wherein the multilayer film comprises a first low acoustic velocity film having a slower acoustic velocity than that of the LT layer and a second low acoustic velocity film having an acoustic velocity between those of the LT layer and first low acoustic velocity film placed in that order from the LT layer side.

3. The acoustic wave device according to claim 2, wherein the first low acoustic velocity film is comprised of $Ta_2O_5$ and the second low acoustic velocity film is comprised of $SiO_2$, and
the differential value is $-366$ kg·p/cm$^3$ to $-216$ kg·p/cm$^3$.

4. The acoustic wave device according to claim 3, wherein a thickness of the LT layer is $0.74p \pm 0.09p$, a thickness of the first low acoustic velocity film is $0.029p \pm 0.008p$, and a thickness of the second low acoustic velocity film is $0.028p \pm 0.012p$.

5. The acoustic wave device according to claim 1, wherein the multilayer film comprises a first low acoustic velocity film having a slower acoustic velocity than that of the LT layer and a second low acoustic velocity film having a slower acoustic velocity than that of the first low acoustic velocity film placed in that order from the LT layer side.

6. The acoustic wave device according to claim 5, wherein the first low acoustic velocity film is comprised of $SiO_2$ and the second low acoustic velocity film is comprised of $Ta_2O_5$, and
the differential value is $-417$ kg·p/cm$^3$ to $-197$ kg·p/cm$^3$.

7. The acoustic wave device according to claim 6, wherein a thickness of the LT layer is 0.67p±0.06p, a thickness of the first low acoustic velocity film is 0.068p±0.014p, and a thickness of the second low acoustic velocity film is 0.039p±0.009p.

8. The acoustic wave device according to claim 1, wherein the multilayer film comprises a first high acoustic velocity film having a faster acoustic velocity than that of the LT layer and a first low acoustic velocity film having a lower acoustic velocity than that of the LT layer placed in that order from the LT layer side.

9. The acoustic wave device according to claim 8, wherein the first high acoustic velocity film is comprised of $Si_3N_4$ and the first low acoustic velocity film is comprised of $Ta_2O_5$, and
the differential value is $-732$ kg·p/cm$^3$ to $-521$ kg·p/cm$^3$.

10. The acoustic wave device according to claim 9, wherein a thickness of the LT layer is 0.65p±0.15p, a thickness of the first high acoustic velocity film is 0.052p±0.013p, and a thickness of the first low acoustic velocity film is 0.1p±0.011p.

11. The acoustic wave device according to claim 1, the multilayer film comprises a first low acoustic velocity film having a slower acoustic velocity than that of the LT layer, a first high acoustic velocity film having a faster acoustic velocity than that of the LT layer, and a second low acoustic velocity film having an acoustic velocity between those of the LT layer and the first low acoustic velocity film placed in that order from the LT layer side.

12. The acoustic wave device according to claim 11, wherein
the first low acoustic velocity film is comprised of $Ta_2O_5$, the first high acoustic velocity film is comprised of $Si_3N_4$, and the second low acoustic velocity film is comprised of $SiO_2$, and
the differential value is $-441$ kg·p/cm$^3$ to $-184$ kg·p/cm$^3$.

13. The acoustic wave device according to claim 12, wherein a thickness of the LT layer is 0.65p±0.05p, a thickness of the first low acoustic velocity film is 0.023p±0.004p, a thickness of the first high acoustic velocity film is 0.02p±0.01p, and a thickness of the second low acoustic velocity film is 0.084p±0.010p.

14. A multiplexer comprising:
an antenna terminal,
a transmission filter which filters a signal output to the antenna terminal, and
a reception filter which filters a signal input from the antenna terminal, wherein
at least one of the transmission filter and the reception filter includes the acoustic wave device according to claim 1.

15. A communication apparatus comprising:
an antenna,
a multiplexer according to claim 14, in which the antenna terminal is connected with the antenna, and
an IC which is connected with respect to the transmission filter and the reception filter on a side opposite to the antenna terminal about a signal route.

16. The acoustic wave device according to claim 1, wherein a thickness of the LT layer is 0.6p or more and less than 0.8p.

17. The acoustic wave device according to claim 1, wherein the substrate has a higher acoustic velocity than the transverse wave acoustic velocity of the LT layer.

* * * * *